United States Patent [19]
Wong

[11] Patent Number: 4,754,216
[45] Date of Patent: Jun. 28, 1988

[54] METHOD AND APPARATUS FOR QUALIFYING THE DECODE WINDOW MARGIN OF A PHASE LOCKED LOOP DATA SYNCHRONIZER

[75] Inventor: Kern W. Wong, Sunnyvale, Calif.

[73] Assignee: National Semiconductor Corporation, Santa Clara, Calif.

[21] Appl. No.: 92,417

[22] Filed: Sep. 3, 1987

[51] Int. Cl.$^4$ ............................................. G01R 25/00
[52] U.S. Cl. ............................. 324/83 D; 324/78 D; 328/133; 331/25
[58] Field of Search ................. 324/77 R, 77 A, 77 E, 324/78 R, 78 D, 73 R, 79 R, 79 D, 83 R, 83 D; 331/25; 328/133, 155; 307/525

[56] References Cited

U.S. PATENT DOCUMENTS

| | | | |
|---|---|---|---|
| 3,916,307 | 10/1975 | Hekimian | 328/155 |
| 3,986,113 | 10/1976 | Vifian | 331/25 |
| 4,151,463 | 4/1979 | Kibler | 331/25 |
| 4,319,329 | 3/1982 | Girgis | 324/78 D |
| 4,617,526 | 10/1986 | Hikawa | 331/25 |
| 4,627,079 | 12/1986 | Van Der Embse | 324/77 E |
| 4,628,282 | 12/1986 | Hikawa | 328/133 |
| 4,641,246 | 2/1987 | Halbert | 324/77 A |
| 4,716,363 | 12/1987 | Dukes et al. | 324/77 R |

*Primary Examiner*—Michael J. Tokar
*Attorney, Agent, or Firm*—Limbach, Limbach & Sutton

[57] ABSTRACT

An ultra-compact window margin performance test apparatus for PLL data synchronizer integrated circuits includes self-contained programmable digital pattern generator, a moveable test bit generator capable of continuously adjustable bit delay time and bit pulse width for up to 25 megabit per second data rate operation. The apparatus also includes two independent oscillators for the 2F reference clock and for general system timing, a selectable Early/Late strobe or window center adjustment, and monitoring signals directly output to oscilloscope and ratio counter for accurate measurement of window margin data. The apparatus may be used to evaluate the bit tolerance merit of the PLL DUT. It may also be used as a design tool for basic PLL analysis and loop filter design optimization works. Additionally, the apparatus is a standardized correlation fixture suitable for use in quality assurance and manufacturing environments. Additionally, a method of static window and phase margins check for a decoding bit under test is employed to characterize the available window width of the PLL DUT and a convenient means as incorporated to optimize these margins.

10 Claims, 4 Drawing Sheets

METHOD AND APPARATUS FOR QUALIFYING THE DECODE WINDOW MARGIN OF A PHASE LOCKED LOOP DATA SYNCHRONIZER

BACKGROUND OF THE INVENTION

1. Field of the Invention

The present invention relates to data recovery systems and, in particular, to the testing and characterization of the "window-time" specification for a phase locked loop (PLL) integrated circuit which is utilized for data synchronization.

2. Discussion of the Prior Art

From a "black box" standpoint, a phase looked loop data synchronizer receives a single channel data stream and outputs two channels of synchronous signals. The first channel is a replica of the input data. The second channel is a periodic clock which is synchronized to the input data.

This type of PLL establishes a "window" around the expected position of bits within the data stream. It permits a fair degree of random displacement, i.e. jitter, of the individual bits within the boundaries of the window with no apparent effect on the accuracy of the recovery of perturbed data.

To achieve optimum data recovery performance, a PLL is designed with a maximum available window width and with a specified minimum skew between the nominal data bit position and its corresponding decode window center.

In order to ensure that a PLL device is operating within its specification, a suitable measurement is required which forces a data test pattern to displace from its ideal position to ascertain the magnitude of displacement the PLL device can tolerate relative to its specified detection window.

Previous techniques for evaluating discrete or hybrid forms of PLL circuitry window margins; that is, the available window width for the data bit and the associated phase margin, i.e. the data pulse position from the theoretical center of its data window) involve elaborate test setups which include pattern, function and pulse generators together with software or firmware required to support programmability for changing to different test vectors. In-system testing, which is the typical technique used within the industry for testing PLLs, is a system rather than a device oriented procedure. Additionally, the conventionally used techniques rely on dynamic test patterns to simulate in-system conditions. This method depends on the ac characteristic of the circuitry. It also depends on the codes, the type of worst-case patterns employed and the bias conditions selected by different users.

A better approach is a "set-up on demand" arrangement. According to this technique, either single-bit or multiple-byte long test patterns are employed. Usually, some specific "worst-case" patterns are incorporated to determine the probablistic distribution of data error accumulated in a given test sequence. The problems with these "on demand" type of arrangements are non-standardized test patterns and a dependence on the data rate, coding method and passive support components used. These techniques are not suitable for data comparison unless the hardware and firmware are uniform and tightly controlled.

SUMMARY OF THE INVENTION

It is a primary objective of the present invention to improve upon the conventional method of laboratory bench testing of the bit tolerance, commonly referred to as the window and phase margins, of a PLL data synchronizer.

Accordingly, the present invention provides a compact PLL test apparatus which obviates the need to interface externally a lab pattern generator, a pulse generator and the required square wave function generators for clocking. The present invention offers uncompromised convenience with no calibration required since there are no external function or pattern generators utilized. The test apparatus of the present invention serves as both a correlation tool and an evaluation board, since the device under investigation, regardless of its eventual application, is examined in a controlled test apparatus. Ambiguity and/or differences regarding both how to route input signals to and from the device under test and the method of generating the test patterns and their physical interface to the PLL device are thus avoided.

Another advantage of the present invention is its provision of the necessary hardware and of a monitoring point which allows the user to optimize the selection of a bias component to nullify the phase-margin offset, i.e. which is the offset of the input data pulse from the ideal center of its data window. Furthermore, this selection or adjustment can also serve to test the amount of window skew, that is available from the PLL device under test.

A preferred embodiment of the phase locked loop test apparatus of the present invention includes a first oscillator which generates a synchronous clock signal which steps a counter. The output of the counter is utilized to cycle the address lines of a programmable read-only-memory which holds 512 test code patterns for the window margin tests, including a sync bit and a reference bit for triggering an oscilliscope and to align a test bit to a known position, respectively. After the PLL device under test has been powered-on, it is set in the non-read mode to allow the PLL to acquire a stable lock to a crystal reference clock provided to the PLL by a second oscillator. The PLL device under test is then switched to the read mode to begin receiving the sequential test patterns from the test pattern ROM. An adjustable ramp rate generator receives a single-bit signal from the ROM and moves the bit to a desired window position. The output of the rate generator is provided to a mono-stable multivibrator which generates a pulse width required of the moveable test bit for the data rate under investigation. An OR gate receives the periodic test pattern from the ROM and the adjusted test bit signal from the mono-stable multivibrator and provides a composite encoded data signal to the PLL device under test. A flip-flop receives a control signal from the ROM as well as the output signal of the VCO of the PLL device under test and provides an output signal representing a window of observation for the moveable test bit. The window observation signal from the flip-flop and the synchronized data output of the PLL device under test serve as inputs to a second OR gate. Thus, the output of the second OR gate is indicative of whether or not the moveable test bit is within or outside of its expected window boundary.

These and other objects, advantages and features of the present invention will be better understood by reference to the following detailed description of a preferred embodiment which should be considered in conjunction with the accompanying drawings.

DETAILED DESCRIPTION OF A PREFERRED EMBODIMENT

Figure 1:
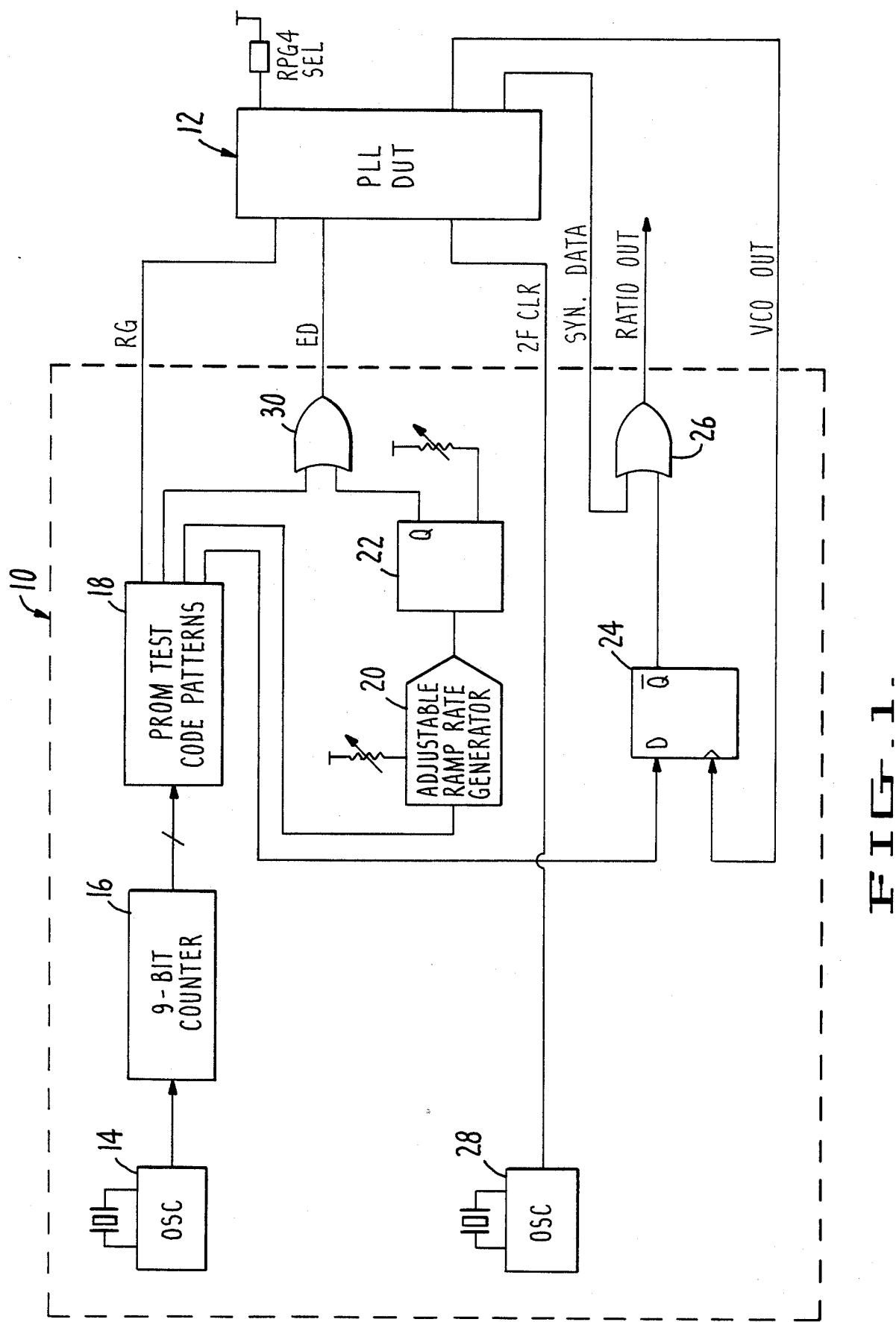
FIG. 1 is a block diagram illustrating a PLL apparatus in accordance with the present invention.

FIG. 1 illustrates, in block diagram form, a test apparatus 10 which operates in accordance with the present invention to test a phase locked loop (PLL) data synchronizer device under test (DUT) 12.

The test apparatus 10 comprises three essential elements: a digital code pattern generator which includes counter 16 and PROM 18, an adjustable ramp rate generator 20 which triggers a monostable-multivibrator 22, and a bit window generator, consisting of flip-flop 24 and OR gate 26, which monitors the ratio of correctly decoded bits per read cycle. Additional supporting circuitry includes two crystal oscillators 14 and 28 which maximize the entropy of the phase step between the Encoded Data ED signal and the VCO comparison pulse introduced to the inputs of the PLL's phase comparator.

The 9-bit synchronous binary counter 16 is configured from a flip-flop and counter elements to cycle the address lines of high speed read-only memory element 18 which contains all of the appropriate test code patterns for the window margin tests, including a sync bit and a reference bit to trigger an oscilloscope and to align a test bit to a known position, respectively.

OR gates 30 and 26 are Advanced Schottky gates which serve both to buffer and gate out data patterns/monitoring wave forms to the PLL DUT 12 and to a ratio counter (not shown), respectively. Oscillators 14 and 28 are high stability CMOS gate oscillators, preferably modified Pierce oscillators, built with crystal resonators. Oscillator 28 provides a 2F reference clock signal 2F CLK to the PLL DUT 12. Oscillator 14 is employed to sequence the remainder of the logic operations of the apparatus.

Mono-stable multivibrator 22 generates the required pulse width of the movable test bit appropriate for the data rate under investigation. It is triggered by an emitter-follower current controlled variable ramp rate pulse shaping circuit 20. Accordingly, the movable test bit may be continuously skewed about the center of its data window position.

Flip-flop 24 and OR gate 26, together with an output from the memory device 18, set up a detection window for the synchronized bit associated with the corresponding movable test bit. If the test bit is within the correct decode window position, the output of OR gate 26 will yield two pulse transitions in each read cycle. Conversely, if the test bit falls outside of its expected window, only one single pulse is produced. This RATIO OUT signal and the Read Gate RG signal can be connected to a ratio counter input for accurate display of when the test bit is within or outside of its expected window boundary. A time measurement system on a real time or a sampling oscilloscope can provide the window-truncation data, i.e. the time between the reference bit's leading edge to the rising edge of the movable bit.

Component RPG4 is an external bias resistor, available in some PLLs, which may be used to adjust the relative time skew between the Encoded Data ED pulse position and its average decode window center. Therefore, it may be employed to nullify any minute, but significant, window offset due to process tolerance. Furthermore, it may also be used to introduce a predetermined amount of Early or Late time shift of the relative window position to determine the extent to which the inherent margin of the PLL DUT 12 is capable of tolerating grossly shifted data pulses, or alternatively, for the evaluation of certain data recovery techniques for adversely skewed data bits.

Figure 2:
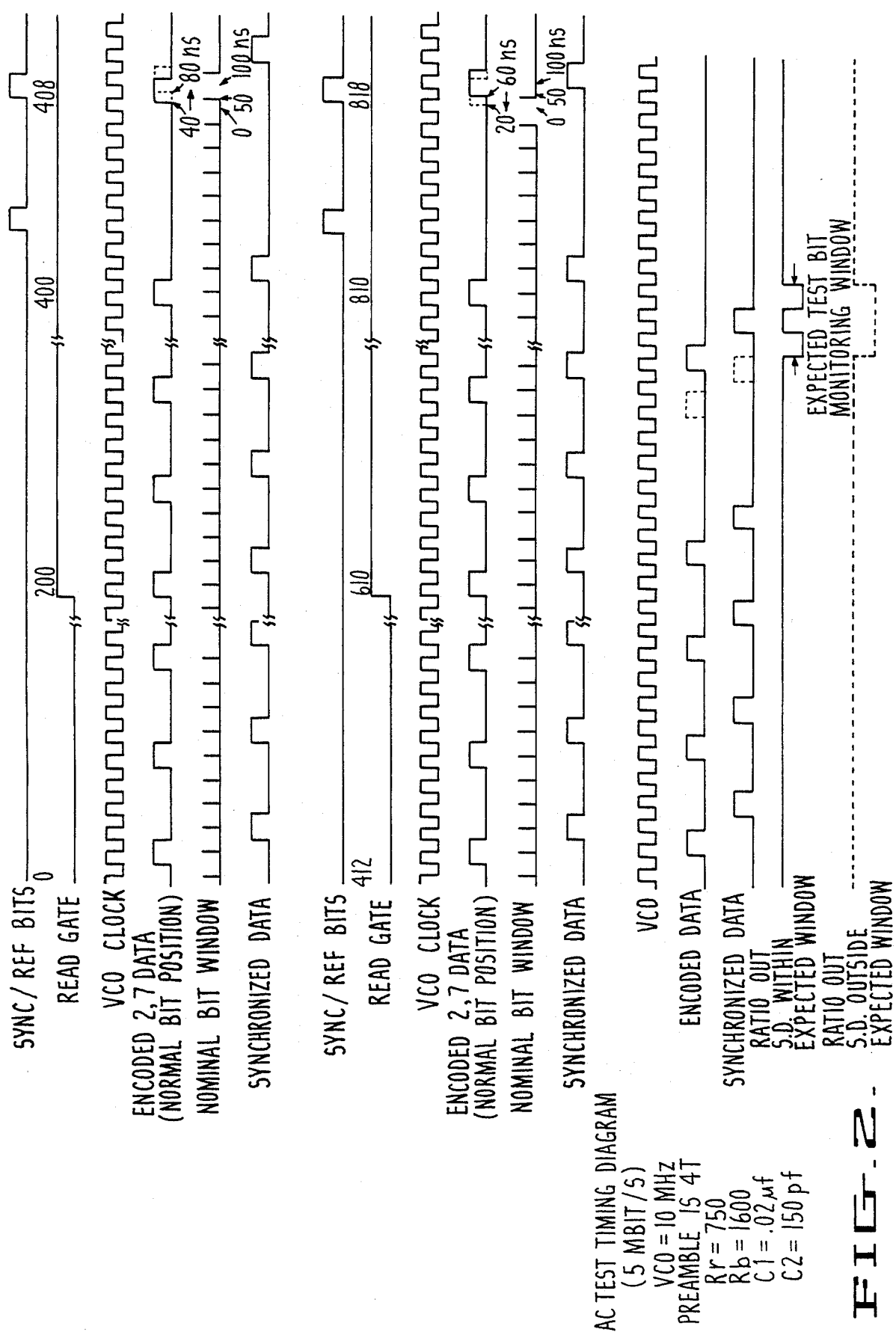
FIG. 2 is a timing diagram illustrating the test pattern and output wave forms generated in the operation of the test apparatus shown in FIG. 4.

FIG. 2 illustrates both the test patterns and test sequence of the test apparatus 10 of the present invention. The PLL DUT 12 is first powered-on and set in the non-read mode, i.e. Read Gate RG is logic low. It will remain in this mode for 200 VCO clock cycles to allow the PLL DUT 12 to acquire a stable lock to a crystal 2F CLK reference source. The DUT 12 is then switched to the read mode, asserting Read Gate RG logic high. This causes the internal input multiplexer of the PLL to switch its input from the crystal 2F CLK reference source to the Encoded Data ED pattern which is asynchronously derived from the digital pattern generator.

The Encoded Data ED pattern consists of a string of 1000... commonly known as the 4T preamble pattern (or a 3T pattern) for the (2,7) enooding method, 2T preamble 1010... for MFM encoding method, ... etc. The PLL DUT 12 can usually lock onto the encoded data in less than 2 bytes time of this pattern. When 16 consecutive preamble patterns, or whatever number is dedicated by the DUT 12 involved, are validated by the PLL internal detection circuitry, the Preamble-Detected output becomes active, indicating that lock has been sufficiently achieved. The preamble pattern continues for a minimum of 200 VCO clock cycles time after Read Gate RG is asserted high to ensure that the DUT 12 will be locked stably prior to the bit tolerance (margin) test.

Following the last preambled pattern, it is necessary to suppress at least as many data pulses as the coding scheme allows before inserting either the Early or Late moveable test bit to avoid interference from an adjacent pulse. The code must not be violated even if the movable bit is allowed to be shifted into an adjacent window position.

In the 5 megabit-sec (Mb/s) data rate example illustrated in FIG. 2, the amount of decode-window loss is determined by shifting a test bit toward the window center starting from 10 ns outside the nominal window boundary. The bit is moved across the window boundary toward the nominal window center in incremental time steps until it resides within a window position or it is recognized by the DUT 12 as being in the appropriate window for a large number of sequential read operations. For the 5 Mb/s specification, maximum half-window loss from a 50 ns ideal half-window width is 10 ns. Hence, the Early test bit, which checks the front half of the window, begins at 10 ns away from the left side of the nominal window boundary and moves toward the center of the window via either a continuous delay adjustment or a fixed time step until the corresponding Synchronized Data output is found at its expected location. Similarly, the Late test bit approaches from the right side of the nominal window boundary starting at 10 ns outside the boundary and shifts toward the window center until the bit is properly recognized in its correct window position.

Figure 3:
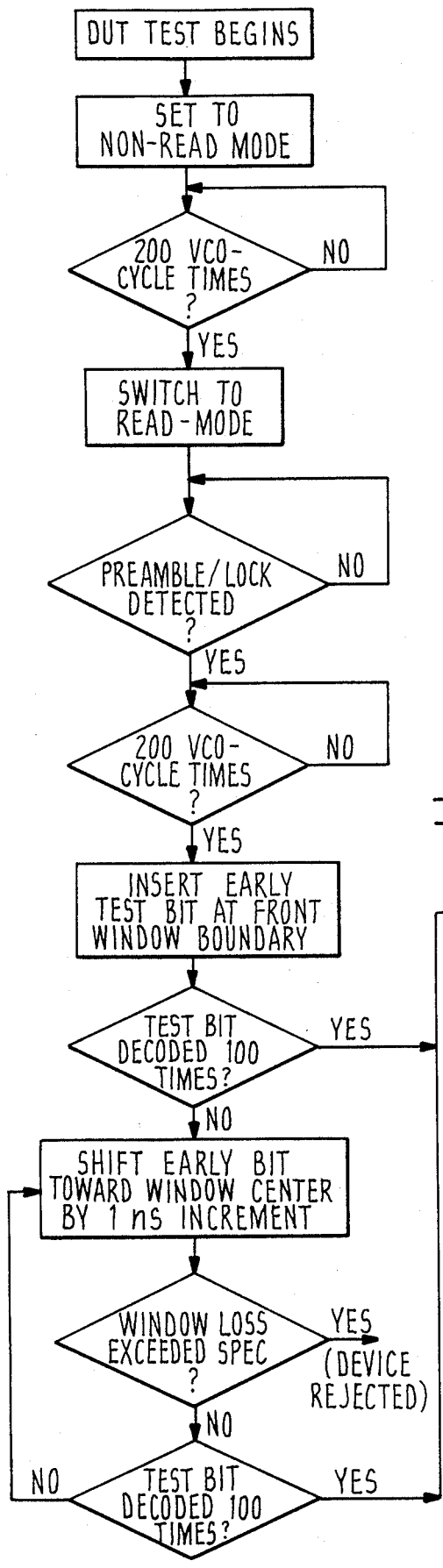
FIG. 3 is a flow chart illustrating a typical test sequence for a test apparatus in accordance with the present invention.

An automated version of the test apparatus may be realized with suitable controlling apparatus, and the test sequence for this implementation is outlined in the flow sheet provided in FIG. 3.

Figure 4:
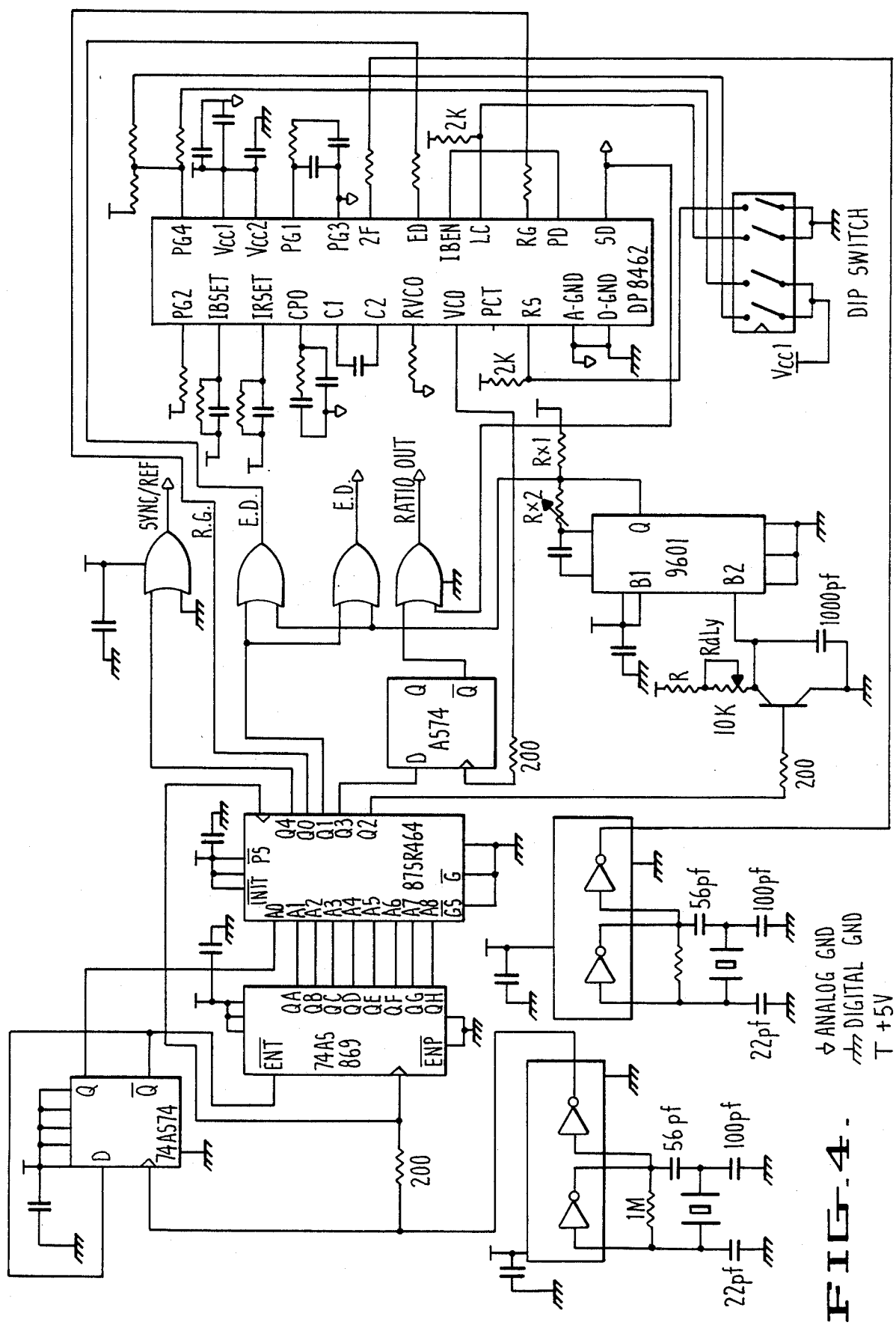
FIG. 4 is a schematic circuit diagram illustrating a PLL test apparatus in accordance with the present invention.

Referring to the schematic diagram provided in FIG. 4, one-half of component U4 and component U6 together form a 9-bit synchronous binary counter which cycles the addresses lines of component U8, a read only memory that contains all the appropriate test patterns for the window test. Component U7 is a high speed Advanced Schottky gate used to buffer and gate the ROM U8 outputs to the PLL device under test U1. Components U2 and U5 are CMOS inverters used to construct two crystal oscillators. Oscillator U2 generates the 2F CLK reference clock, while oscillator U5 sequences the rest of the logic chips. Component U9, a monostable multivibrator, is used to set the pulse width of a single movable bit within the Encoded Data pattern string. Transistor Q1 and its associated passive components realize a piece-wise linearly variable threshold adjustment that is capable of continuously skewing the movable bit about its window center position. The other half of component U4, with an "OR" gate of component U7 and together with ROM U8, set up a detection window for the synchronized bit associated with the corresponding movable test bit. If the test bit is within the correct decode window position, pin #6 of component U7 will yield two pulses in every read cycle. If the test bit falls outside of its expected window, only a single pulse is produced from this output of component U7. Hence, this output and the Read Gate RG can be connected to the inputs of a ratio counter for an accurate display of when the bit is within or outside of its expected window. The time measurement system in a laboratory oscilloscope can provide accurate window readings.

The variable resistor Rdly is used to shift the test bit about its window center. Variable resistor $R \times 2$ is used to adjust the pulse width of the movable bit, which should be set equal to the width of the Encoded Data pulses from the pattern generator ROM U8. DIP switch U3 consists of four switches used to set Lock Control, Preamble Select, and to select a different current supplied to PG4 to control window centering or to introduce a predetermined amount of early or late shift of the window.

The center frequency of the VCO may be checked according to the following simple technique. First, the PLL DUT U1 CPO is set at ground potential and the VCO minimum frequency is measured. Then, approximately 3 volts is applied to CPO and again the maximum VCO frequency is measured. The arithmetic mean of these two measured frequency values yields the equivalent center frequency.

Before powering up the device under test, it should be noticed that the test circuit has been designed so that it is possible to provide each section of the test circuit, the device under test, the 2F clock oscillator and the rest of the digital circuitry with an independent +5 V regulated supply.

After power has been on, components U2 and U5 are checked for proper 2F frequency outputs. Next, ROM U8 is monitored to insure that all the test patterns are present. An oscilloscope is triggered with the sync/ref bits output and this wave form is also displayed on the CRT. Pin 8 of component U7 should present two pulses, a sync bit followed by a reference bit from pin Q4 of ROM U8. Pin Q0 of ROM U8 is the Read Gate RG sequence which is high for 312 2F CLK clock cycles and low for 200 2F clock cycles. Pin #3 of gate U7 outputs the Encoded Data ED pattern from pin Q1 of ROM U8. Pin Q1 of ROM U8 consists of a train of 4T patterns starting when Read Gate RG is asserted. At the end of the 4T patterns, there is an isolated pulse. The $R \times 2$ potentiometer is then adjusted so that the width of this isolated pulse matches those of the 4T pattern (or any one of the reference bits). Also, adjustment of Rdly should shift this pulse. The test bit is positioned such that its leading edge aligns perfectly with the leading edge of the reference bit. This alignment procedure places the movable test bit in the nominal center of its decode window. Pins Q5 and Q6 of ROM U8 are optional sync signals for triggering an oscilloscope to monitor other areas of the test sequence.

The test procedure is as follows. DIP switch SW-3 is set for LOCK CTL to (H) for phase frequency mode during preamble acquisition; switch SW-4 is set for preamble select to (H) for 4T preamble; switches SW-1 and SW-2 both set to (L). This selects RPG4E=3K ohms on the board. Then the synchronized data and VCO outputs are checked. They should be stable and in lock by the arrival of the sync/ref bits, at least 200+VCO cycles after Read Gate RG assertion.

To test the available half-window width, i.e. the compliment of the half-window loss, RDLY is adjusted slowly while encoded data, sync/ref bits, synchronized data or RATIO OUT are monitored. Read Gate RG and RATIO OUT should be connected to a digital ratio counter.

The ratio counter normally reads a perfect 2.0000 ratio when the test bit is within its proper decode window. The test bit is then moved away from its centered position, with respect to the reference bit positive edge, in either direction. As long as the test bit remains inside the available decode window, a ratio of 2 will be displayed on the counter. When the test bit begins to fall outside of its decode window, even occasionally, the ratio count will deviate from a perfect 2 ratio, indicating the window boundary has been reached. The time span between the leading edge of the movable bit and that of the reference bit, which corresponds to the available half-window width, is then measured. This figure is subtracted from 25 ns (for a 10 mb/s data rate) yielding the window number (half-window truncation). The same procedure is then repeated for the other half of the decode window. If a ratio counter is not used, the SYN DATA or RATIO OUT node can be monitored on an oscilloscope screen. As the pulse is shifted toward the adjacent window position, it will begin to fade; this is the point where the window measurement should be made. This alternate test also provides a reasonably accurate estimate of the window truncation specification.

Figure 5:
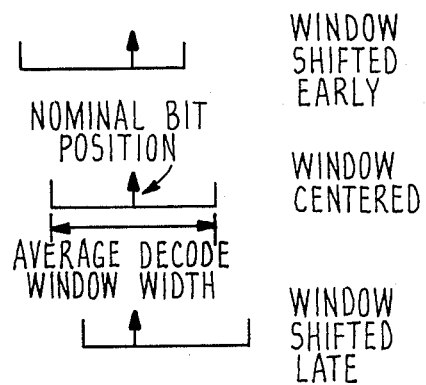
FIG. 5 is a schematic diagram illustrating three possible window shift options for testing a PLL.

Switches number 1 and number 2 of component U3, along with various RPG4 components, are provided for the user who desires to experiment with Early/Late strobe or select RPG4 in a system designed for minimum window offset. To experiment with these difference options, the following procedure is followed (for 10 mb/s transfer rates). Referring to FIG. 5, RPG4E is chosen to be approximately equal to 6.2 K ohms, RPG4T approximately 620 ohms and a 5.0 K ohm potentiometer is selected for the RPG4L. Next, switches number 1 and number 2 are set to (H). This selects RPG4E only. With a relatively large resistor value, a low level bias current is allowed to the PG4 pin. This produces a wider LATE window in a correspondingly smaller EARLY window. Switch number 1 is then set to (L) and switch number 2 to (H). This selects RPG4E and RPG4T in parallel. The effective RPG4 value will be the smallest of all the combinations of RPG4 resistor, and, hence a large bias current into PG4. This yields a wider EARLY window and a narrower LATE window. Switch number 1 is then set to (H) and number 2 to (L). This selects RPG4E and RPG4L. The combined value nulls out the window offset. For an easier setup, one can utilize a single potentiometer for RPG4L to determine an optimum RPG4 resistor value to nullify any inherent window offset.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of testing the decode window margin and nullifying the offset of a phase locked loop (PLL), the method comprising the steps of:
    stabilizing the PLL with a crystal reference in the non-read mode;
    stabilizing the PLL with a code preamble pattern in the read mode;
    after a predetermined number of clock cycles of the PLL's voltage controlled oscillator (VCO), suppressing normal data patterns and introducing a moveable test bit into encoded data streams provided to the PLL;
    shifting the test bit about a reference position which is the average decode window center of the test bit;
    determining the amount of available window width or the amount of window loss by use of a time measurement system and a ratio monitoring technique between the read gate and ratio out signals thereby producing an accurate indication of when a test bit is within or outside of its expected boundary such that selection of an appropriate bias element value to symmetrically center the test bit about its average decode window nullifies any inherent offset off the PLL.

2. The method according to claim 1 wherein a static moveable test bit scheme is used to shift the test bit's time position about an expected decode window position.

3. The method according to claim 2 wherein the moveable bit is mechanized by a linear ramp threshold generator to trigger a monostable multivibrator for delay or shift of the test bit's time position.

4. The method according to claim 1 wherein the test vectors and code patterns are embedded in a read only memory asynchronously clocked to the PLL inputs.

5. The method according to claim 1 wherein the number of read gate cycles and the correctly decoded moveable test bit, the synchronized data pulse, form a ratio output indication signal for accurately monitoring the proper decoding of a test bit to qualify the performance margins of the PLL.

6. A phase locked loop test apparatus comprising:
    (a) a first oscillator which generates a synchronous clock signal;
    (b) a counter which is stepped by the synchronous clock signal and generates an output comprising sequential addresses;
    (c) a read-only-memory (ROM) which stores a plurality of test patterns and serially outputs individual test patterns in response to addresses received from the counter;
    (d) a second oscillator which generates a crystal reference clock which is provided to a PLL device under test;
    (e) an adjustable ramp rate generator which receives a test bit signal from the ROM, the ramp generator including a potentiometer which can be adjusted to vary the timing of the data test bit signal;
    (f) a mono-stable multivibrator which receives the adjusted data test bit signal and generates a required pulse width of the data test bit appropriate for the data rate under investigation;
    (g) an OR gate which receives a periodic test pattern from the ROM and the adjusted data test bit signal from the mono-stable multivibrator and provides a composite encoded data signal as an output;
    (h) a flip-flop which receives a control signal from the ROM and the output signal of the PLL's VCO and provides an output signal representing a window of observation for the moveable test bit; and
    (i) a second OR gate which receives the synchronized output data of the PLL device under test and the observation window signal from the flip-flop and provides a ratio out signal which is indicative of whether the data test bit is within or outside of its expected window boundary.

7. The apparatus according to claim 6 wherein the test vector and test patterns are coded in the high speed registered memory cell array which contains specially arranged sync and reference pulses and appropriate digital patterns for control and encoded data inputs to the PLL DUT.

8. The apparatus according to claim 6 wherein a synchronized data bit window is generated for accurate monitoring of when mis-decode of the test bit occurs.

9. The apparatus according to claim 6 wherein an adjustable ramp rate generator comprising an emitter-follower and a RC network, together with a mono-stable multivibrator with adjustable pulse width are employed to generate a suitable moveable test bit for any data rate of interest on the PLL DUT thereby eliminating the need for expensive tapped delay lines and providing continuous delay variation.

10. The apparatus according to claim 6 wherein two crystal resonator controlled, modified pierce-type gate oscillators are used for the 2F reference clock and for the system clock.

* * * * *